United States Patent [19]

Oldfield

[11] Patent Number: 5,017,865
[45] Date of Patent: May 21, 1991

[54] COAXIAL MICROWAVE DEVICE TEST FIXTURE

[75] Inventor: William W. Oldfield, Redwood City, Calif.

[73] Assignee: Wiltron Company, Morgan Hill, Calif.

[21] Appl. No.: 363,500

[22] Filed: Jun. 7, 1989

[51] Int. Cl.$^5$ .......................... G01R 31/02; H01P 5/00
[52] U.S. Cl. ................................ 324/158 F; 333/246; 333/260
[58] Field of Search ............. 324/158 F, 73 PC, 58 R, 324/58 A, 58 B; 333/246, 247, 260; 439/578, 581, 867

[56] References Cited

U.S. PATENT DOCUMENTS

| | | | |
|---|---|---|---|
| 3,662,318 | 5/1972 | Decuyper | 333/260 |
| 3,775,644 | 11/1973 | Cotner et al. | 324/158 F |
| 4,143,342 | 3/1979 | Cain et al. | 333/246 |
| 4,365,195 | 12/1982 | Stegens | 333/246 |
| 4,535,307 | 8/1985 | Tsukii | 333/246 |
| 4,707,656 | 11/1987 | Marzan | 324/158 F |
| 4,808,919 | 2/1989 | Sylviane et al. | 324/158 F |
| 4,851,764 | 7/1989 | Usui | 324/158 F |

OTHER PUBLICATIONS

"A Broad Band Stripline . . . ", The Microwave Journal; Mar. 1968; p. 52.

Primary Examiner—Ernest F. Karlsen
Attorney, Agent, or Firm—Fliesler, Dubb, Meyer & Lovejoy

[57] ABSTRACT

A microwave fixture for testing microwave devices having a pair of clamping assemblies for resiliently clamping the microwave devices therein. At least one of the clamping assemblies is adapted to be moved longitudinally and laterally relative to the other clamping assembly for use in testing microwave devices having non-axially aligned circuit configurations. An assembly of pusher pins is also provided for making electrical connections between plural microwave devices which are coupled in series for testing.

17 Claims, 6 Drawing Sheets

COAXIAL MICROWAVE DEVICE TEST FIXTURE

BACKGROUND OF THE INVENTION

1. Field of the Invention

The present invention relates to microwave device test fixtures in general and in particular to a coaxial test fixture for testing carrier-mounted and non-carrier-mounted microstrip and coplanar devices.

2. Description of the Prior Art

Microwave device test fixtures to which the present invention relates are generally used for testing microstrip and coplanar devices before they are mounted in a permanent housing.

A conventional microstrip device comprises a thin fragile substrate. The substrate typically comprises a ceramic material, such as alumina. An electrically conductive material, such as gold, is plated on one surface, i.e. top surface, of the substrate and then etched to form one or more electrical conductors thereon. Various types of circuit devices may also be mounted on the top of the substrate and connected to the conductors thereon. An electrically conductive material, such as gold, is also plated on the opposite surface, i.e. bottom, of the substrate so as to provide a ground plane for the device circuits. For some applications the substrate is then mounted on a relatively thicker block of metal which increases the thickness of the ground plane and serves as a carrier for the substrate. Such devices are commonly called carrier mounted devices. In some applications the carrier is not required or used.

Coplanar devices are similar to microstrip devices except that the ground plane is located on the top of the substrate adjacent to, but spaced from, the center conductor.

In practice, the conductors on the top of the substrate, the ground plane and the carrier, when used, extend to the edge of the substrate where they are available to be connected to other microwave components, such as other microstrip circuits, in a microwave device or to connectors in a microwave device test fixture.

Conventional microwave device test fixtures of the type used for testing microstrip and coplanar devices typically comprise a pair of upstanding spaced metallic blocks in each of which is mounted a coaxial microwave RF connector having an outer conductor and a center conductor. A base member is provided between the blocks for supporting the microwave device under test (DUT), i.e. the stripline or coplanar device. In some fixtures, the base member is permanently installed. In others, the base member is removable. Whether permanently installed or removable, the size of the DUT, i.e. its length, width and thickness, is typically limited by the size of the base member on or in which the DUT is mounted for testing. Therefore, to accommodate a range of device sizes, an equal number of specially designed and sized base members is usually required.

To test a microwave device, such as a microstrip, in a conventional test fixture having a base member as described above, it has been the practice to mount the strip on the base member so as to permit an electrical connection between the ground plane and circuit of the device and the outer and center conductors of the coaxial connectors in the fixture, respectively. In many such fixtures, the RF connectors are axially aligned and rigidly fixed in position so that relative transverse movement of the connectors is not possible, thus restricting use of the fixture to testing microstrip having axially aligned circuit terminals.

In certain ones of the above-described prior known fixtures, the connection to the ground plane is made through the bottom of the carrier while the connection to the microstrip circuit is made by forcing the center conductor of the coaxial connector or an extension thereof against the microstrip circuit. A disadvantage of this type of fixture is that the ground path between the outer conductor of the fixture connectors and the ground plane of the microstrip through the carrier is undesirably long and thus excessively inductive.

A pair of prior known fixtures comprising a means for reducing the length of the ground path are described in an article by P. J. Lang et al, *Microwave Journal,* May, 1988 at page 365. In these fixtures, a close connection with the ground plane is made through a pressure contact which is forced axially against an upper edge of the carrier below the substrate near the ground plane. While effectively reducing the length of the ground path, disadvantages of these fixtures are that the fixtures can be used only for testing carrier-mounted microstrip devices and must provide a means for applying orthogonal as well as axial pressure to the device under test in order to make the necessary electrical connections therewith.

In general, prior known fixtures for testing microstrip and coplanar circuits have been limited to testing carrier-mounted circuits having axially aligned terminals, have required a base or other member for supporting the carrier-mounted circuit and have not been usable for testing more than one substrate at a time.

SUMMARY OF THE INVENTION

In view of the foregoing, a principal object of the present invention is an improved fixture for testing microstrip circuits and coplanar devices on one or more substrates having axially or non-axially aligned circuits and a ground plane with or without a carrier.

The fixture, in accordance with the present invention, comprises a pair of clamping assemblies. Each clamping assembly comprises a fixed and a spring-loaded movable jaw member and an RF coaxial connector. The jaw members are mounted on a metallic block in which one of the RF connectors is mounted and arranged to clamp an edge of the microstrip substrate so as to make a good electrical contact with the substrate ground plane while pressing the microstrip circuit on the upper surface thereof firmly against the center conductor or an extension thereof of the RF connector.

One of the clamping assemblies in the fixture is movably mounted for transverse and longitudinal movement relative to the other clamping assembly so that substrates of various lengths, multiple substrates, and substrates having non-axially aligned circuit terminals can be tested.

The connectors in the clamping assemblies are rigidly mounted in the same horizontal plane so that the clamping force of the jaw members on the opposite ends of the substrate will not exert a bending force on the substrate sufficient to crack or break the substrate.

Each pair of jaw members is designed to provide the maximum clamping force on the ground plane immediately below the point where the center conductor of the coaxial connector makes contact with the circuit on the opposite surface of the substrate. This insures a good ground connection while minimizing the length of the ground path and inductance associated therewith.

In a preferred embodiment of the present invention, each of the movable jaw members is curved about a vertical axis. The curved movable jaw member is movably mounted to the block in which the connector is mounted and at an angle thereto so that the upper, center, rear portion of the jaw member is held firmly against the block as the jaw member is moved vertically against the ground plane of the substrate beneath the point where the center conductor of the connector in the block contacts the circuit on the substrate.

A pair of dielectric members are provided on the face of the block so as to provide a stop for substrates inserted in the jaw members. The stop prevents the substrate from coming into close contact with the block thereby reducing undesirable capacitive effects which would otherwise result, and improving repeatability.

In a modification of the preferred embodiment, there is provided a plurality of cam-operated pushers. The pushers which extend downwardly from cantilevered supporting members are used for making good electrical connections between plural substrates when the fixture is used for testing a plurality of substrates coupled in series.

In still another embodiment of the present invention, the fixture is supplied with edge-clamping members for holding a plurality of substrates which are to be tested in the fixture.

From the foregoing it will be appreciated that the size, i.e. length, width and thickness, of substrates which can be tested in fixtures made according to the present invention is virtually unlimited. Moreover, the installation in, and the removal of, the devices from the fixture is easy and the tests which can be performed thereon are highly repeatable.

BRIEF DESCRIPTION OF THE DRAWINGS

The above and other objects, features and advantages of the present invention will become apparent from the following detailed description of the accompanying drawings in which.

DETAILED DESCRIPTION OF THE DRAWINGS

Figure 1A:
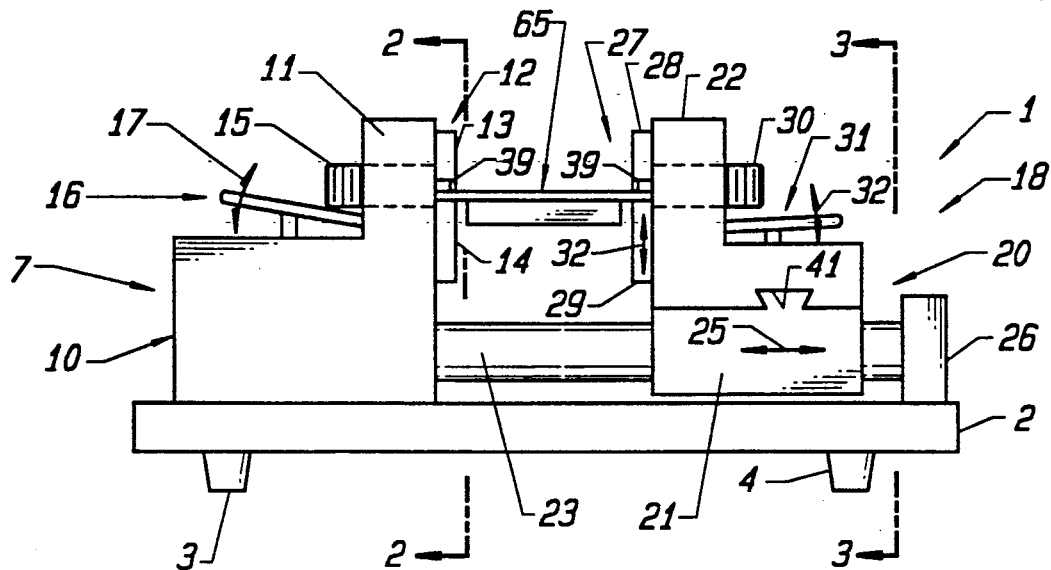
FIG. 1A is a side elevation view of a test fixture for microwave devices according to the present invention.
Figure 1B:
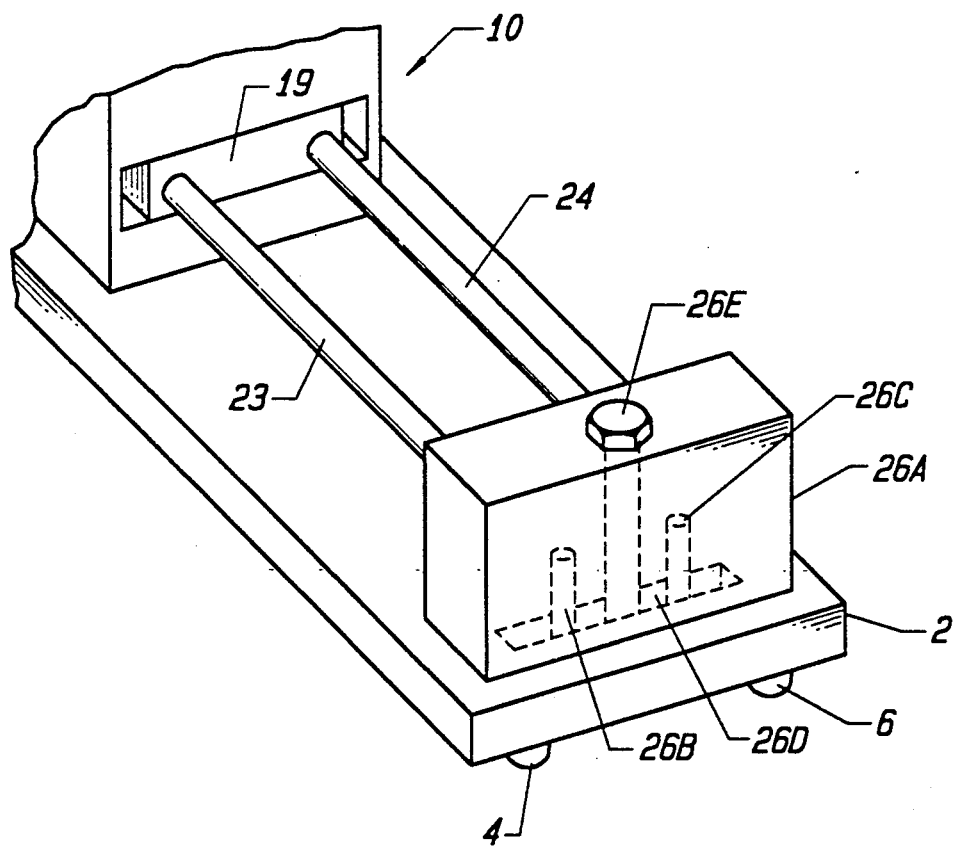
FIG. 1B is a partial perspective view of an alternative embodiment of the present invention.
Figure 2:
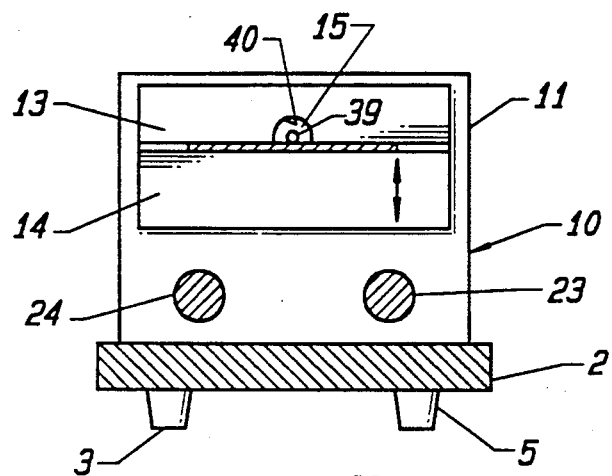
FIG. 2 is a cross-sectional view taken in the direction of lines 2—2 of FIG. 1.
Figure 3:
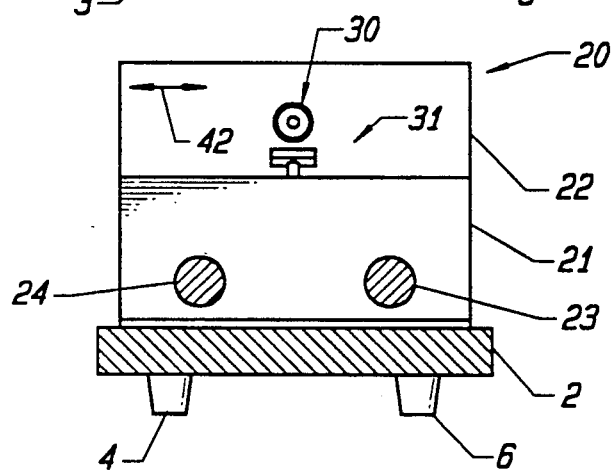
FIG. 3 is a cross-sectional view taken in the direction of lines 3—3 of FIG. 1.

Referring to FIGS. 1-3, there is provided in accordance with the present invention a test fixture for testing microstrip and coplanar devices designated generally as 1. In the fixture 1 there is provided a generally rectangular base member 2 which is supported on a plurality of foot members 3-6. Rigidly mounted to the left end of the base member 2 there is provided a first clamping assembly 7 comprising an L-shaped block member 10 which has a vertically extending section or leg 11. Mounted to the interior surface of the section 11 there is provided a pair of metallic jaw members designated generally as 12, comprising an upper fixed jaw member 13 and a lower movable jaw member 14. Centrally mounted in the section 11 there is provided an RF coaxial microwave connector 15. As will be further described below, there is mounted on the upper surface of the block 10 a movable lever assembly designated generally as 16 which is movable in the direction shown by the arrow 17 for opening and closing the jaw members 12.

At the right end of the fixture 1 there is provided a second clamping assembly 18 comprising an L-shaped block assembly designated generally as 20. Block assembly 20 comprises a lower generally rectangular block member 21 and an L-shaped upper block member 22. Lower block member 21 is slidably mounted on a pair of supporting rods 23 and 24 for sliding movement in a longitudinal direction relative to the block 10, as shown by the arrow 25. The left ends of the rods 23 and 24 are supported by the block 10. The right ends of the rods 23 and 24 are supported by an upstanding member 26 rigidly attached to the base member 2.

Mounted to the interior surface of the L-shaped block member 22 there is provided a pair of metallic jaw members 27 comprising an upper fixed jaw member 28 and a lower movable jaw member 29. Centrally located in the member 22 there is provided an RF coaxial microwave connector 30. Movably mounted to the top of the lower portion of the L-shaped member 22 there is provided a lever assembly 31. Assembly 31 is provided for moving the lower jaw member 29 for opening and closing the clamping assembly 18 as shown by the arrow 32.

Figure 7:
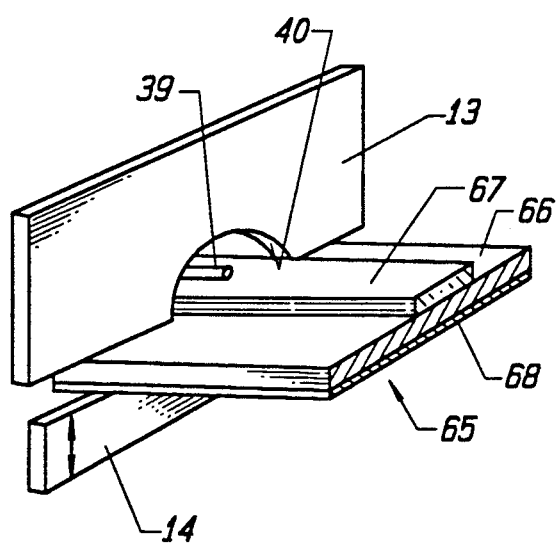
FIG. 7 is an enlarged partial perspective view of one pair of jaw members used in the fixture of FIG. 1 with a substrate clamped therebetween.

As shown more clearly in FIGS. 2 and 7, there is provided in the upper fixed jaw members 13 and 28 a clearance hole 40. As will be further described below, clearance hole 40 is provided for bridging a circuit member located on the top of a substrate inserted in the clamping assemblies 7 and 18.

The L-shaped block member 20 is slidably attached to the lower block member 21 by a dovetail joint 41. The dovetail joint 41 permits the L-shaped member 22 to be moved laterally relative to the lower block member 21 and thus laterally relative to clamping assembly 7, as shown by the arrow 42 in FIG. 3.

Referring to FIG. 1B, in an alternative embodiment of the present invention, lateral movement of the clamping assembly 18 is provided by mounting the left end of the rods 23, 24 in a block 19 slidably mounted in the block member 10 and the right end of the rods 23, 24 in a movable block 26A. The block 26A slides on the top of the base member 2. A pair of guide pins 26B and 26C extend downwardly from the block 26A and into a lateral slot 26D provided therefore in the base 2. Pins 26B and 26C insure precise lateral movement of the block 26A and rods 23 and 24. A bolt 26E and a slide nut (not shown) are used for locking the block 26A in position after it has been moved.

Referring to FIGS. 8-11, with the exception of having a means for moving the clamping assembly 18 relative to the clamping assembly 7 as described above, clamping assemblies 7 and 18 are substantially identical. Accordingly, only clamping assembly 18 will be described in detail.

Figures 9, 10:
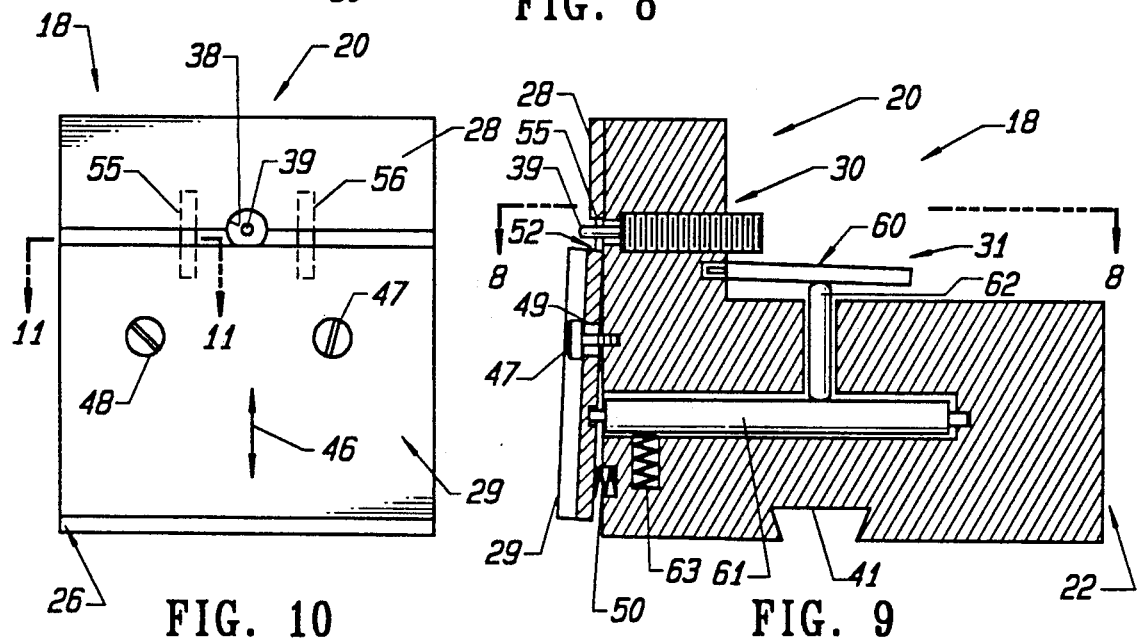
FIG. 9 is a cross-sectional view taken in the direction of lines 9—9 of FIG. 8.
FIG. 10 is an elevation view of the jaw members of FIG. 9.

As shown in FIGS. 8-11, the lower movable jaw member 29 is provided with a small radius (greatly exaggerated in FIG. 8), i.e. curved, about a vertical line parallel to the vertical movement of the jaw member as shown by the arrow 46 in FIG. 10. The member 29 is mounted to the interior surface of the block member 22 by means of a plurality of retaining pin members 47 and 48. Each of the pin members 47 and 48 are provided with an enlarged head and inserted in a slot 49 provided therefor in the member 29. The slot 49 is provided to allow vertical movement of the member 29, as will be further described below. Below the pin members 47 and 48 there is provided a pair of spring members 50 and 51. Spring members 50 and 51, using retaining pin members 47 and 48 as a fulcrum, urge the lower end of the jaw member 29 outwardly so as to press the upper center rear edge of the jaw member 29 against the surface of the block 22 so as to provide a contact point 52 as close as possible to the RF connector 30. This arrangement minimized the length of the ground path and distance between the center conductor and the ground plane and thus the inductance associated with a long ground path.

Figure 8:
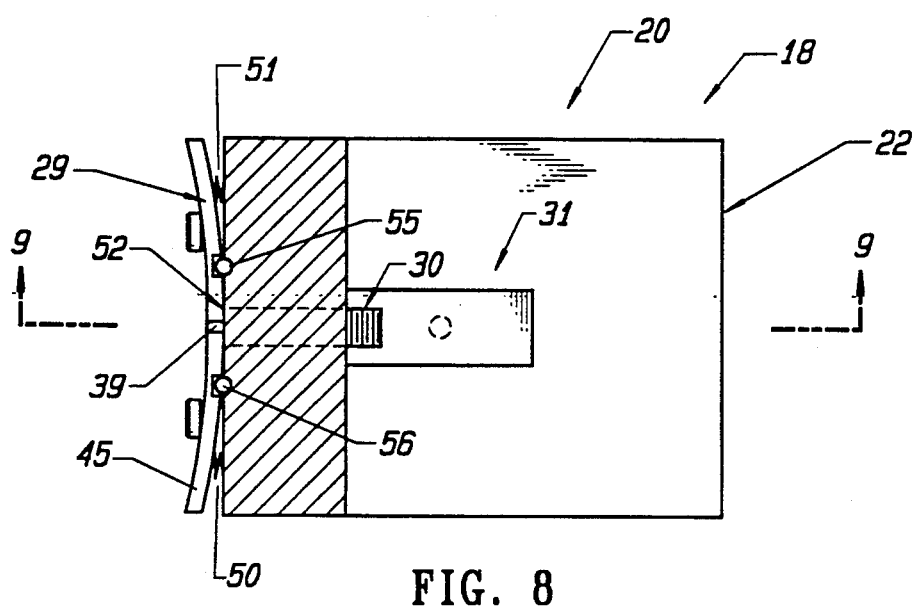
FIG. 8 is a partial cross-sectional view taken in the direction of lines 8—8 of FIG. 9.
Figure 11:
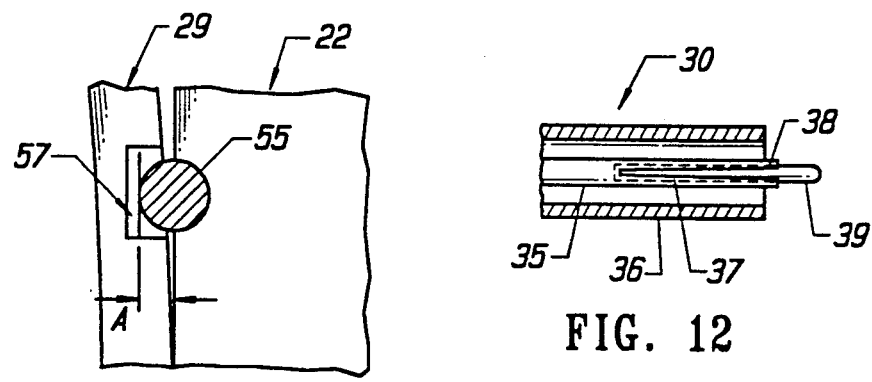
FIG. 11 is a partial cross-sectional view taken in the direction of lines 11—11 of FIG. 10.

As shown more clearly in FIGS. 8, 10 and 11, there is provided behind the upper jaw member 28 and lower jaw member 29 a pair of dielectric rod members 55 and 56. A clearance space 57 is provided in the rear of the jaw member 29 into which the rod members 55 and 56 project. The rod members 55 and 56 serve as rear stops for a substrate inserted between the jaw members 28 and 29 so that the substrate inserted between the jaw members 28 and 29 is spaced from the metallic L-shaped block member 22 by a distance A as shown in FIG. 11 thus reducing capacitance therebetween.

As shown in FIG. 9, there is provided in the lever assembly 31 a lever arm 60, an elongated rod member 61, a vertical coupling member 62 and a spring member 63. The left end of the lever arm 60 is attached to the L-shaped block assembly 20 for pivotal movement relative thereto. Similarly, the left end of the rod member 61 is pivotably connected to the movable jaw member 29 while the right end of the rod member 61 is pivotably coupled to the L-shaped block member 22. The coupling member 62 is pivotably connected to the lever arm 60 at its upper end and to the rod member 61 at its lower end. The spring member 63 is inserted in a hole provided therefor in the L-shaped block member 22 for urging the rod member 61, and thus jaw 29, to their uppermost positions.

In use, downward pressure on the end of the lever arm 60 pushes on the coupling member 62 and depresses the rod member 61 against the force of the spring member 63. As the rod member 61 is depressed, the jaw member 29 is forced downwardly, opening the jaw members 27 for the insertion of a substrate therebetween, as will be further described below.

Figure 4:
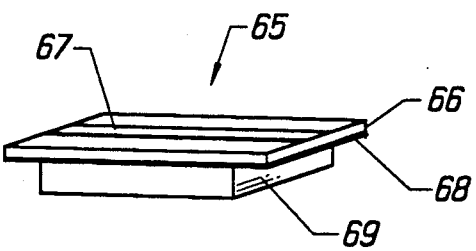
FIG. 4 is a perspective view of a carrier-mounted substrate which can be tested in the fixture of FIG. 1.
Figure 5:
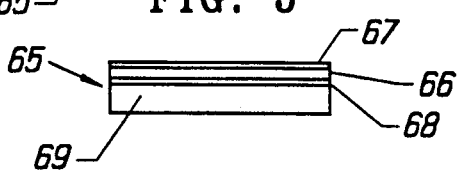
FIG. 5 is a side view of the substrate of FIG. 4.
Figure 6:
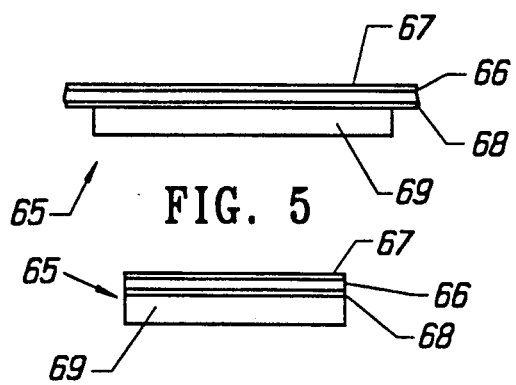
FIG. 6 is an end view of the substrate of FIG. 4.
Figure 12:
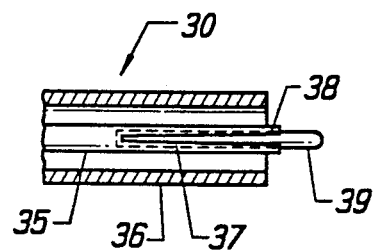
FIG. 12 is a cross-sectional view of the end of an RF connector according to the present invention.

Referring to FIG. 12, since each of the RF connectors 15 and 30 are substantially identical, only connector 30 will be described in detail. As shown in FIG. 4, the RF connector 30 comprises a center conductor 35 and an outer conductor 36. In a preferred embodiment of the present invention, the center conductor 35 comprises a short bore 37. The walls of the center conductor are split, as shown at 38, for a distance approximately equal to the full length of the bore 37. A pin 39 is inserted into the bore 37. The space between the center conductor 35 and the outer conductor 36 comprises a dielectric such as air or a solid dielectric material. As will be further described below, the split 38 is provided for increasing the flexibility of the center conductor 35 so that the pin 39 acts more like a spring member when a substrate is clamped in the clamping assembly.

Referring to FIGS. 4-7, there is shown a carrier-mounted microstrip designated generally as 65. In the microstrip 65 there is provided a substrate 66. On the top of the substrate 66 there is provided an electrical circuit member 67. On the bottom surface of the substrate 66 there is provided a ground plane 68. Below the ground plane 68 and attached thereto there is provided a metallic carrier member 69. The carrier member 69 is not required in all microstrip devices and may be omitted in certain applications.

Figure 13:
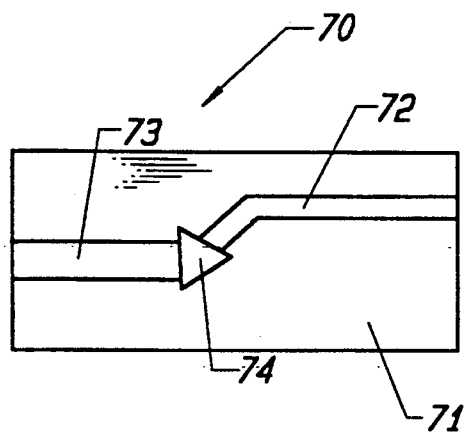
FIG. 13 is a plan view of a microwave device having non-axially aligned circuit members on the top surface thereof which can be tested in the fixture of FIG. 1.

Referring to FIG. 13, there is provided another type of microstrip device designated generally as 70. In the device 70 there is provided a substrate 71 and a ground plane (not shown). On the top of the substrate 71 there is provided a pair of non-axially aligned electrical circuit members 72 and 73 coupled to a microwave circuit member 74, such as a filter, diode, or the like.

Figure 14:
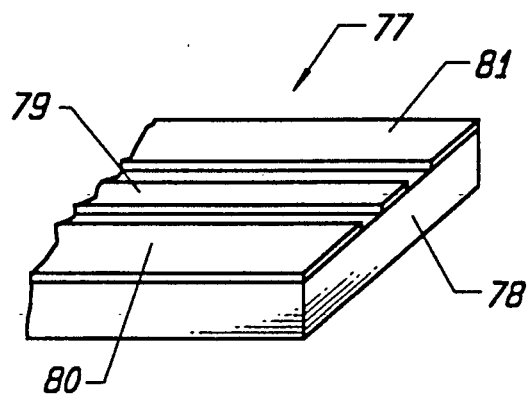
FIG. 14 is a perspective view of a coplanar microwave device.

Referring to FIG. 14, there is provided a microwave coplanar device designated generally as 77. In the device 77 there is provided a substrate 78. Located on the top of the substrate 78 there is provided an electrical circuit member 79. On opposite sides of the circuit member 79 and electrically insulated therefrom there is provided a pair of ground planes 80 and 81.

To use the fixture 1 to test the microstrip 65 shown in FIGS. 4-7, the clamping assembly 18 is moved away from the clamping assembly 7 by an amount sufficient to permit the insertion of the microstrip 65 therebetween. Once the assemblies 7 and 18 are separated, the lever arm 60 in the lever assembly 16 is depressed, opening the jaw members 13 and 14. An end of the microstrip 65 is then inserted between the jaw members 13 and 14 until the end abuts the dielectric rod members 55 and 56. When the microstrip 65 abuts the dielectric rod members 55 and 56, the lever arm 60 in the lever assembly 16 is released, allowing the lower jaw member 14 to clamp the microstrip 65 therein. As the microstrip 65 is being clamped between the jaw members 13 and 14, the circuit member 67 contacts the pin member 39 in the RF connector 15, causing the pin member 39 to flex slightly upwardly. The flexure of the pin member 39 insures a good electrical contact between the center conductor 35 of the RF connector 15 and the circuit 67 on the top of the microstrip 65. At the same time, the lower jaw member 14 and specifically the upper center rear edge thereof, makes electrical contact with the ground plane 68 immediately below the pin 39, thereby providing a minimal low inductive ground path. At the same time, the clearance hole 40 in the upper jaw member 13 bridges the electrical circuit 67 so as not to short the circuit member 67 to the ground plane.

After the left end of the microstrip 65 is inserted between the jaws 13 and 14, the clamping assembly 18 is gently moved to the left while the lever arm 60 in the lever assembly 30 is depressed. With the lever arm 60 depressed, the lower jaw member 29 is lowered, allowing the right end of the microstrip 65 to be butted against the dielectric rod members 55 and 56 in the L-shaped block member 22. Thereafter, the lever arm 60 in the lever assembly 31 is released, clamping the right end of the microstrip 65 between the jaw members 28 and 29. Suitable testing circuitry can then be coupled to the RF connectors 15 and 30 to perform tests on the microstrip 65.

Referring again to FIG. 13, the insertion of the microstrip 70 in the fixture 1 is accomplished in the same manner as described above with respect to the device 65, except that to couple the pin 39 of the RF connector 30 to the circuit 72, the L-shaped block assembly 20 is moved laterally relative to the lower block member 21 so as to center the pin member 39 on the circuit member 72.

Referring again to FIG. 14, the coplanar device 77 shown therein is inserted in the clamping assemblies 10 and 27 in the same manner as described above with respect to the devices 65 and 70. However, with the ground planes 80 and 81 located on top of the substrate 78, the upper jaw members 13 and 28 provide the means for connecting the ground planes 80 and 81 to the outer conductors 36 of the RF connectors 15 and 30, respectively.

Figure 15:
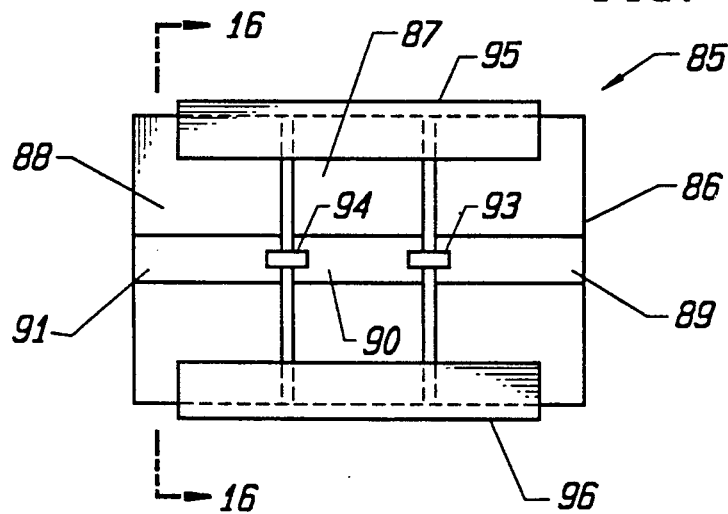
FIG. 15 is a top plan view of three microstrip devices held together by edge-clamping members according to the present invention.
Figure 16:
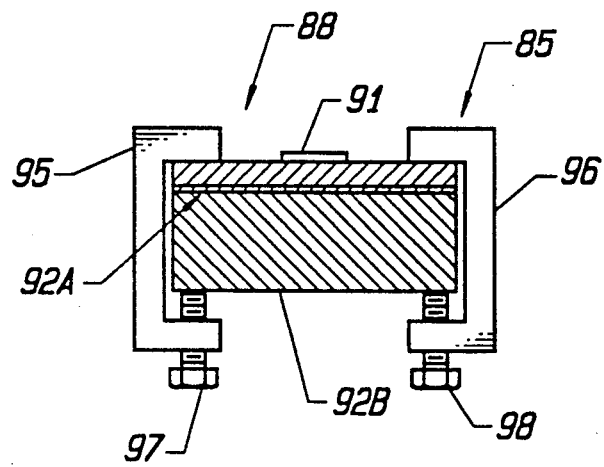
FIG. 16 is a cross-sectional view taken in the direction of lines 16—16 of FIG. 15.

Referring to FIGS. 15 and 16, there is shown an assembly of microstrips designated generally as 85. In the assembly 85 there is provided three microstrip devices 86, 87 and 88, comprising a plurality of electrical circuits 89, 90 and 91, respectively. Each of the microstrips 86, 87 and 88 are provided with a ground plane 92A and supported on a metalic carrier 92B which extends beneath all of the substrates and provides a rugged, i.e. rigid, support therefor which interconnects the ground planes of the individual substrates, as shown more clearly in FIG. 16. The circuits 89, 90 and 91 are electrically coupled by electrical ribbons 93 and 94 which are bonded to the circuits 89, 90 and 91 in any suitable manner. Along the lateral edges of the assembly 85 there is provided a pair of C-shaped clamping members 95 and 96. Each of the clamping members 95 and 96 is provided with a plurality of screw members 97 and 98 for clamping the microstrips 86, 87 and 88 in a rigid manner.

To test the assembly 85, the assembly 85 is inserted between the clamping assemblies 11 and 27 in the same manner as the devices 65, 70 and 77 described above.

Referring to FIGS. 17-20, there is provided in another embodiment of the present invention a pair of substantially identical pusher assemblies designated generally as 100A and 100B, respectively. Only assembly 100A is described in detail. In the assemblies 100A and 100B there are provided a plurality of dielectric pin members 101, 102 and 103. The pin members 101-103 are supported from the ends of a plurality of spring members 104, 105 and 106. The spring members 104-106 in assemblies 100A and 100B are mounted to the top of the clamping assemblies 18 and 7 in a cantilevered fashion, respectively. Beneath the spring members 104-106 there is provided a cam assembly designated generally as 107. In the cam assembly 107 there is provided a plurality of cam members 108, 109 and 110. The cam members 108-110 are provided to engage the spring members 104-106, respectively. The cam assembly 107 in the clamping assemblies 100A and 100B are supported from the clamping assemblies 18 and 7 by means of a pair of brackets 111 and 112 which extend outwardly from the clamping assemblies 18 and 7, respectively. The cam members 108-110 are coupled to a shaft 113, on the end of which is provided a knob 114.

Figure 20:
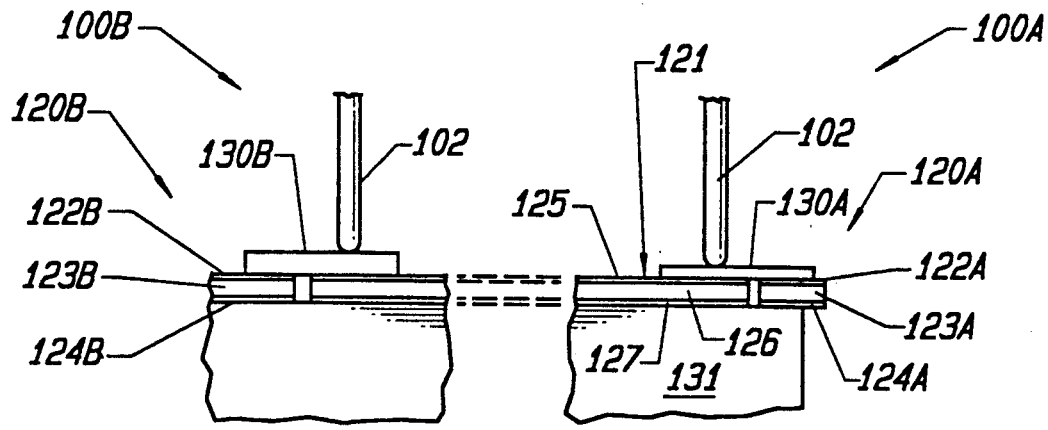
FIG. 20 is an enlarged view taken in the direction of lines 20—20 in FIG. 17.

As seen more clearly in FIGS. 17 and 20, below the assemblies 100A and 100B there is shown a plurality of microstrip devices 120A, 120B and 121. The microstrip devices 120A and 120B are provided with an electrical circuit 122A and 122B mounted on a substrate 123A and 123B, respectively. Ground planes 124A and 124B are provided on the bottom of the substrates 120A and 120B, respectively. In the device 121, which is the device being tested, there is provided an electrical circuit 125 which is mounted on a substrate 126 having a ground plane 127 located on the bottom thereof. Attached by a suitable bonding method to the circuits 122A and 122B there is provided a pair of electrical ribbons 130A and 130B, respectively. A supporting member 131 is provided for supporting and interconnecting the ground planes of the microstrip 121 and the microstrips 120A and 120B during testing of the microstrip 121, as will be further described below.

Figure 17:
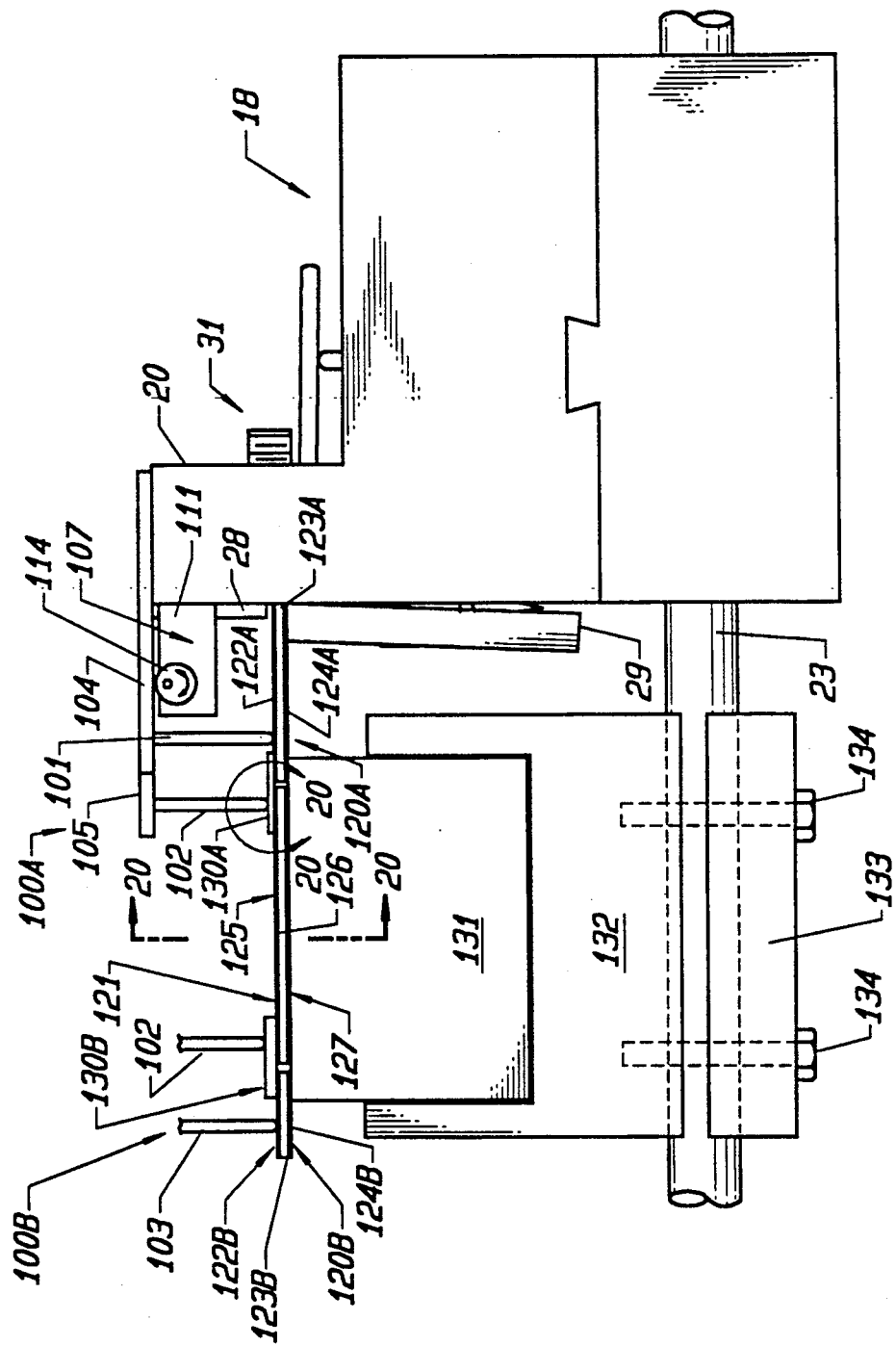
FIG. 17 is a side elevation view of a modification according to another embodiment of the present invention incorporating a plurality of pusher members.
Figure 19:
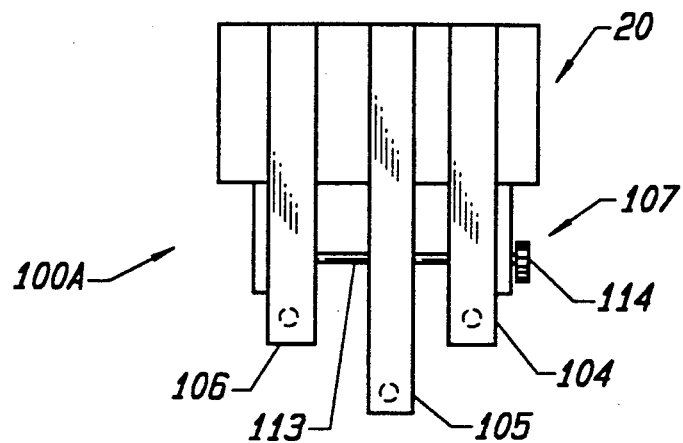
FIG. 19 is a top plan view of the pusher members of FIG. 18.
Figure 18:
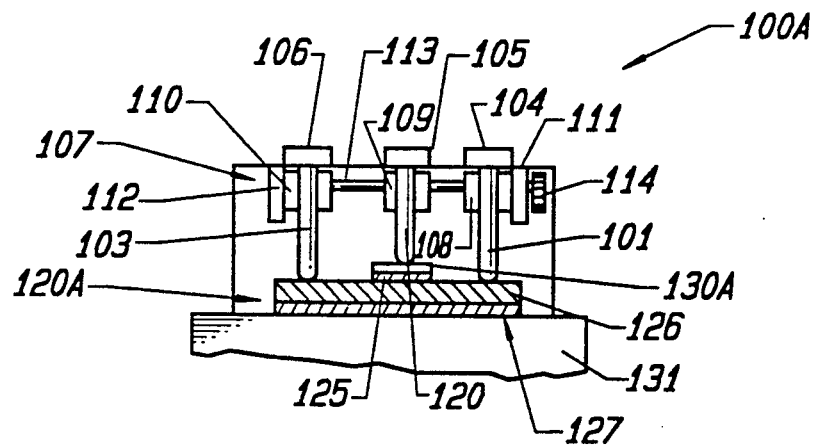
FIG. 18 is a front elevation view of the pusher members of FIG. 17.

As seen more clearly in FIG. 17, the member 131 is slidably mounted in a U-shaped block 132 so as to permit lateral movement of the device 121 relative to the devices 120A and 120B. The block 132 is clamped to the rods 23 and 24 by means of a clamping block 133 and a plurality of bolts 134.

To test the microstrip device 121, an end of the devices 120A and 120B is inserted in the clamping assemblies 18 and 7, respectively, as described above with respect to the devices 65, 70, etc. With an end of the devices 120A and 120B inserted in the clamping assemblies 18 and 7, the supporting member 131 with the microstrip device 121 mounted thereon is placed beneath opposite ends of the microstrip devices 120A and 120B and supported there by the block 132, clamping block 133 and bolts 134. Once the microstrip device 121 is properly positioned relative to the microstrip devices 120A and 120B, the knob 114 is rotated so as to lower the pins 104-106 onto the devices 120A, 120B and 121. As the cam members 108-110 are rotated by the rotation of the knob 114, the pin members 104 and 106 are first lowered against the substrates 120A and 120B. As the pin members 101 and 103 are lowered, they press the microstrip devices 120A and 120B firmly against the supporting member 131 so as to provide a good connection between the ground planes on the devices 120A, 120B and 121. Thereafter, further rotation of the knob 114 lowers the pin member 102 against the ribbons 130A and 130B, pressing the ribbons 130A and 130B against the circuit member 125 on the microstrip device 121, thus making a good electrical connection between the electrical circuits 122A, 122B and 125. Thereafter, suitable test equipment is coupled to the fixture 1 to make the necessary RF tests.

From the foregoing description of preferred embodiments of the present invention, it is apparent that a variety of microwave devices of varying lengths, widths and thicknesses can be tested separately or in combination with other devices by simply adjusting the relative positions of the clamping assemblies 7 and 18, and, if necessary, using the supporting block 131.

While preferred embodiments of the present invention are described above, it is contemplated that various modifications may be made thereto without departing from the spirit and scope of the present invention. Accordingly, it is intended that the scope of the invention not be limited to the embodiments described but be determined by reference to the claims hereinafter provided and their equivalents.

What is claimed is:

1. A test fixture for testing a microwave device having a substrate on which is located an electrical circuit member and a ground plane comprising:
    a first and a second clamping means, each one of said first and second clamping means including a fixed jaw member and a spring-loaded movable jaw member, said spring-loaded movable jaw member having a spring member coupled thereto for spring biasing said movable jaw member toward said fixed jaw member for resiliently clamping an end of said substrate therebetween;
    a coaxial RF connector located in each of said first and second clamping means adjacent to said fixed and movable jaw members therein, said coaxial RF connector having a center conductor which extends into a space provided therefor between the facing surfaces of said fixed movable jaw members for making an electrical contact with said electrical circuit member and an outer conductor electrically connected to said jaw members for making an electrical contact with said ground plane by means of said jaw members when said end of said substrate is clamped therebetween; and
    means coupled to said movable jaw member in each of said first and second clamping means which is responsive to a force applied thereto for moving said movable jaw member away from said fixed jaw member against the force of said spring member to thereby open said fixed and movable jaw members.

2. A test fixture according to claim 1 comprising:
    means for slidably interconnecting said first and said second clamping means, said interconnecting means including means for allowing sliding movement of said first clamping means relative to said second clamping means in a longitudinal direction on said interconnecting means.

3. A test fixture according to claim 1 comprising:
    means for slidably interconnecting said first and said second clamping means, said interconnecting means including means for allowing sliding movement of said first clamping means relative to said second clamping means in both a longitudinal and a transverse direction on said interconnecting means.

4. A test fixture according to claim 1 wherein said fixed and movable jaw members in each of said first and second clamping means are mounted on a metallic block and further comprising means located on said metallic block for preventing contact between said end of said substrate and said metallic block when said substrate is inserted between said fixed and movable jaw member.

5. A test fixture according to claim 4 wherein said preventing means comprises a dielectric means.

6. A test fixture according to cliam 5 wherein said preventing means comprises a plurality of spaced, elongated dielectric members.

7. A test fixture according to claim 1 wherein said fixed and said movable jaw member in each of said first and second clamping means are mounted on a metallic block and said movable jaw member comprises a curved plate-like member which is curved about a vertical line extending parallel to the direction of movement of said movable jaw member and further comprising means for mounting said movable jaw member on said metallic block in such a manner that the upper center rear edge of said movable jaw member adjacent to said block and said fixed jaw member slides on the surface of said bock as said movable jaw member is moved relative to said fixed jaw member.

8. A test fixture according to claim 7 wherein said mounting means comprises a pair of retaining members which are located in slots in said movable jaw member for retaining said movable jaw member on said block while allowing said movable jaw member to be moved vertically and spring means located below said pin-like members between said movable jaw member and said block member which uses said retaining members as a fulcrum for resiliently holding said upper center rear edge of said movable jaw member against said block member.

9. A test fixture according to claim 1 wherein said moving means comprises:
    a movable rod-like member having one end which engages said movable jaw member;
    a spring means which engages said rod-like member for resiliently urging said movable jaw member toward said fixed jaw member; and
    a movable lever arm with a pin member extending therefrom which is adapted to engage said rod-like member for moving said rod-like member and said movable jaw member against the force of said spring member when downward pressure is applied to said lever arm.

10. A test fixture according to claim 1 wherein said center conductor comprises a hollow tubular split end portion into which a pin member is inserted, said split end portion being adapted to expand and contract as lateral pressure is applied to and removed from said pin member, respectively.

11. A test fixture according to claim 1 wherein said substrate comprises a first substrate having said ground plane located on the bottom surface thereof and further comprising:
    a plurality of pusher members, a of said pusher members being adapted for pushing the opposite end of said first substrate against a metallic substrate supporting member located therebeneath and a second one of said pusher members being adapted for pushing an electrical ribbon which extends from an electrical circuit member at said opposite end of said first substrate against an electrical circuit member on a second substrate having a ground plane located on the bottom surface thereof which is supported by said metallic substrate supporting member; said electrical ribbon providing an electrical connection between said circuits on said first and said second substrates and said metallic substrate supporting member providing an electrical connection between said ground planes on said first and said second substrates.

12. A test fixture according to claim 11 comprising:
means for mounting said first and said second pusher members in said fixture in a cantilever fashion; and
means for moving said pusher members toward and away from said first and said second substrates.

13. A test fixture according to claim 12 wherein said means for mounting said first and said second pusher members in said fixture in a cantilever fashion comprises a first and a second elongated spring member and said pusher member moving means comprises cam means for moving said first and said second pusher members toward and away from said first and said second substrates in a predetermined sequence.

14. A test fixture according to claim 13 wherein said cam means comprises a first and a second cam member for engaging said first and said second spring members, respectively.

15. A test fixture according to claim 1 comprising:
a pair of C-shaped clamping members for clamping a plurality of substrates together end-to-end while opposite ends of said plurality of substrates are being clamped by said first and said second clamping means.

16. A test fixture according to claim 1 wherein said means for slidably interconnecting said first and said second clamping means comprises:
a pair of spaced elongated rod-shaped members having said second clamping means located at one end thereof;
a movable block assembly mounted on said rod-shaped members so as to permit said movable block assembly to be moved in a sliding fashion on said rod-shaped members; and
means for mounting said first clamping means on said movable block assembly so that said first clamping means can be moved toward and away from said second clamping means when said movable block assembly is slid toward and away from said second clamping means on said rod-shaped members.

17. A test fixture according to claim 16 wherein said movable block assembly comprises:
a first block member which is mounted on said rod-shaped members so as to permit said first block member to be moved in a sliding fashion on said rod-shaped members toward and away from said second clamping means;
a second block member which is slidably mounted on said first block member so as to permit said second block member to be moved in a sliding fashion on said second block member in a transverse direction relative to said second clamping means; and
means for mounting said first clamping means on said second block member.

* * * * *

UNITED STATES PATENT AND TRADEMARK OFFICE
CERTIFICATE OF CORRECTION

PATENT NO. : 5,017,865

DATED : May 21, 1991

INVENTOR(S) : WILLIAM W. OLDFIELD

It is certified that error appears in the above-identified patent and that said Letters Patent is hereby corrected as shown below:

```
Column 10, line  2, "member" should be "members".
           line 19, "bock" should be "block".
           line 55, after "a" (second occurrence) insert
                    --first one--.
Column 12, line  1, after "claim" change "1" to --2--.
```

Signed and Sealed this

Fifteenth Day of September, 1992

Attest:

DOUGLAS B. COMER

*Attesting Officer*     *Acting Commissioner of Patents and Trademarks*